United States Patent [19]

Miyazaki et al.

[11] Patent Number: 4,800,640
[45] Date of Patent: Jan. 31, 1989

[54] AUTOMATED ASSEMBLY SYSTEM AND METHOD OF ASSEMBLY

[75] Inventors: Hiroshi Miyazaki; Takao Miyatani; Akira Ishizaki; Shinpei Abe, all of Toyota, Japan

[73] Assignee: Toyota Jidosha Kabushiki Kaisha, Aichi, Japan

[21] Appl. No.: 24,556

[22] Filed: Mar. 11, 1987

[30] Foreign Application Priority Data

Apr. 15, 1986 [JP] Japan ............................. 61-56463[U]

[51] Int. Cl.$^4$ .............................................. B23P 11/00
[52] U.S. Cl. ........................................ 29/429; 29/786; 29/794; 414/222; 414/750
[58] Field of Search ................ 29/429, 771, 779, 786, 29/781, 788, 789, 790, 794, 793, 809, 819, 822, 823, 739, 740, 741; 198/346.2, 468.2, 468.8; 414/222, 225, 226, 750, 753

[56] References Cited

U.S. PATENT DOCUMENTS

| | | | |
|---|---|---|---|
| 3,986,623 | 10/1976 | Keller | 414/225 |
| 4,377,986 | 3/1983 | Juve | 414/222 X |
| 4,459,743 | 7/1984 | Watanabe et al. | 29/740 |
| 4,573,262 | 3/1986 | Dornes et al. | 29/771 X |
| 4,595,328 | 6/1986 | Seitz et al. | 414/225 |

*Primary Examiner*—P. W. Echols
*Assistant Examiner*—Andrew E. Rawlins
*Attorney, Agent, or Firm*—Finnegan, Henderson Farabow, Garrett and Dunner

[57] ABSTRACT

An automated assembly system comprising a pair of spaced supporting frames on which a corresponding pair of guide rails extend transversely in a direction perpendicular to the direction of conveyance of a workpiece. Two movable arm units, each having tool heads movably mounted thereon, are supported on the spaced frames. A feed unit is mounted on each of the support frames for moving independently a corresponding one of the two movable arm units along the guide rails in a direction perpendicular to the direction of conveyance of the workpiece.

5 Claims, 3 Drawing Sheets

AUTOMATED ASSEMBLY SYSTEM AND METHOD OF ASSEMBLY

BACKGROUND OF THE INVENTION

1. Field of the Invention

The present invention relates to an automated assembly system; and more particularly, to an automated assembly system for an assembly line wherein components are attached to a workpiece while being carried in a direction transverse to the path of the assembly line.

2. Description of Related Art

As shown in FIG. 5, one conventional automated assembly system includes a first arm 51 extending in a direction parallel to the conveyance direction A of a workpiece 20. A second arm 52 extends at right angles to the first arm 51; and is reciprocally movable along the length of arm 51. The second arm 52 has an attached shaft 53, movable in a direction perpendicular to the conveyance direction A of the workpiece 20, with a vertically shiftable tool head 153. Thus, the tool head 53 is movable in X, Y, and Z coordinates.

In operation, a component 9 is first gripped by the tool head 153. Then, while the tool head 153 is moved along a transverse path 55 above the first arm 51 to avoid contact therewith, the component 9 is positioned above the workpiece 20; and thereafter, is automatically attached to the workpiece.

Although the components 9 may be placed in a pallet 10 either in a non-orderly or orderly fashion, they are not necessarily presented in the precise orientation required for being immediately attachable to the workpiece 20. To accomplish such precise orientation, additional means are necessary for placing the components 9 in the proper arrangement prior to their attachment to the workpiece. However, the addition of such means to the system shown in FIG. 5, requires a larger space. Also, because the second arm is supported at only one point by the first arm 51, there is a problem in using a tool having a heavy head, such as a multiple shaft tool head; and accommodating a reaction force, which may be generated in the event the components are assembled, by press fitting to the workpiece.

SUMMARY OF THE INVENTION

It is, therefore, an object of the present invention to provide an automated assembly system, wherein a movable arm unit for attaching components to a workpiece, and another movable arm unit for placing such components in a precise orientation, which is movable in the same direction as the first movable arm unit, are each positioned independently of the other.

It is another object of the present invention to provide a system for effectively accomplishing automated assembly, wherein movable arm units are each supported at opposite ends for accommodating a reaction force as components are press fit into a workpiece, and yet occupies minimal space.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, an automated assembly system of this invention comprises a pair of spaced supporting frames; a pair of guide members, each mounted on one of the support frames and extending longitudinally substantially parallel to each other in a direction transverse to the first direction; first and second arm units, each supported on the pair of frames and mounted to move along both guide members; first feed means mounted on one of the pair of frames operably coupled to the first arm unit for moving the first unit along both of the guide members; second feed means mounted on another one of the pair of frames operably coupled to the second arm unit for moving said second unit along both of the guide members; and a pair of tool units, each one movably mounted on a respective arm unit to move in a direction parallel to the first direction.

Preferably, the pair of support frames includes guide members extending in a direction perpendicular to the direction of conveyance of the workpiece and positioned above the workpiece. The support frames may be of any suitable shape, such as T-shaped, when viewed in the direction of the path of the workpiece.

Preferably, the two movable arm units extend from one guide member to the other, and are movable reciprocally along the guide members in a direction perpendicular to the conveyance direction of the workpiece. One of the units is adapted to carry an automatic assembly head; and the other arm unit is adapted to carry a component orienting tool. The automatic assembly head and the component orienting tool are both movable in a direction parallel to the direction of conveyance of the workpiece.

Preferably, each of the two arm units are movable separately and individually by their own feed means. One of the two feed means are provided on one of the supporting frames; and the other of the two feed means is provided on the other of the supporting frames. Each of the feed means are automatically controlled with high accuracy in accordance with instructions from a control system.

In a system of the present invention, the two arm units are each individually movable, one of which is used to attach components to a workpiece, and the other of which is used to place the components in a precise orientation. With this arrangement, both arm units are moved along the same path. Thus, the components are carried to the workpiece a minimum distance on the same path.

The accompanying drawings, which are incorporated in and constitute a part of this specification, illustrate one embodiment of the invention, and together with the description, serve to explain the principles of the invention.

DETAILED DESCRIPTION OF THE PREFERRED EMBODIMENT

Figure 1:
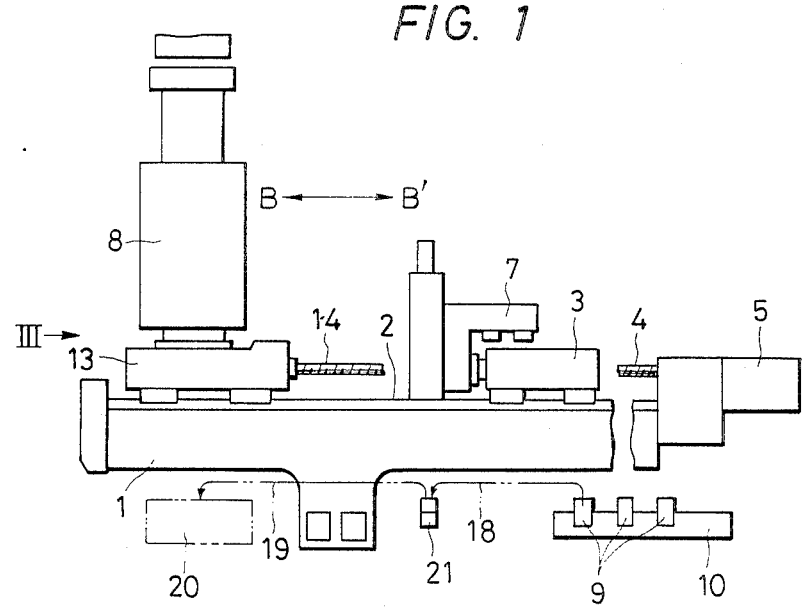
FIG. 1 is a front view in elevation of one embodiment of an automated assembly system according to the present invention.
Figure 2:
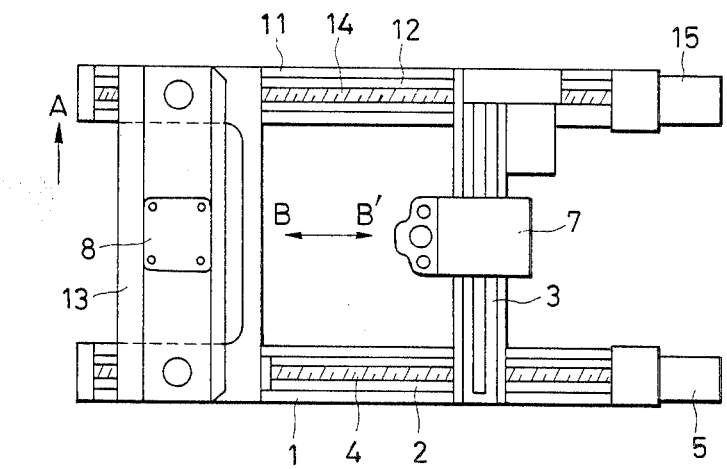
FIG. 2 is a top plan view of the assembly system of FIG. 1.

With reference to FIGS. 1 through 4 of the drawings, a pair of T-shaped supporting frames 1, 11, each includes a vertical portion and a transverse portion joined on top of the vertical portion. Immediately below and adjacent one side of the transverse portion of each support frame 1, a workpiece 20 is conveyed by a conveyor (not shown) in the direction of the arrow referred to as A.

Disposed on each transverse portion of the spaced frames 1, 11 are respective guide rails 2, 12 which are bridged by movable arm units 3, 13. Each of the units 3, 13 are reciprocally moved perpendicular to the path of the workpiece 20 in the directions of the double headed arrows referred to as B—B by feed screws 4, 14 rotated by a corresponding motor 5, 15. It will be appreciated that although both units 3, 13, share common guide rails, 2, 12, each one of the units 3, 13 has its own drive system; and thus, they are reciprocally movable independently.

Figure 3:
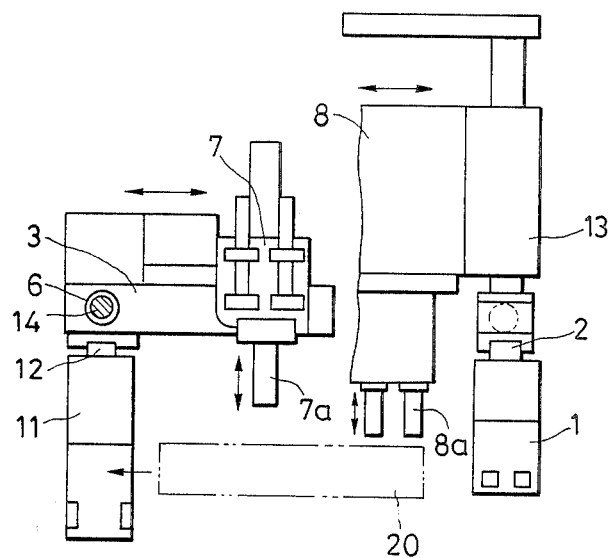
FIG. 3 is a side view in elevation of the automated assembly system of FIG. 1, and looking in the direction of the referenced arrow III.

As shown in FIG. 3, the movable arm unit 3 has a hole 6 through which the feed screw 14 for driving the movable arm unit 13 projects, which prevents contact between movable unit 3 and feed screw 14. Similarly, movable unit 13 has a hole (not shown) through which the feed screw 4 projects for moving the arm unit 3, thus preventing contact between feed screw 4 and the movable unit 3.

The movable arm unit 3 has a single shafted tool 7, which as a vertically shiftable head 7a thereon. Tool 7 is movable along arm unit 3 in a direction parallel to the direction A of the conveyance path of the workpiece 28. The movable unit 13 has a multi-shaft tool 8 with a head 8a thereon. Multi-shaft tool 8 is movable in a direction parallel to the conveyance path direction A of the workpiece 20.

In operation, components 9 on a pallet 10 are first gripped by the single shaft tool 7 in the movable arm unit 3. Then, as shown in FIG. 1, the components 9 are carried along a path 18 transverse to the conveyance path of workpiece 20 to a station 21 where they are placed in a predetermined arrangement or orientation.

Upon operation of the movable unit 13, the components 9, which are already properly oriented, are gripped by the multi-shaft tool 8. The components 9 are then carried along a path 19, as shown in FIG. 1, to a position above the workpiece 20 for purposes of assembly.

As stated above, the single shaft tool 7 and multi-shaft tool 8 are independently movable in directions B and B', which are perpendicular to the direction A of the conveyance path of the workpiece 20. Thus, the proper orientation of the components 9 by the tool 7, and attachment of the components 9 to the workpiece 20 by the tool 8, are simultaneously carried out at the same work station.

In addition, the movable units 3, 13 share the guide rails 2, 12 on the support frames 1, 11, thus bringing the system into a compact arrangement. The movable arm units 3, 13 are also supported by opposite ends by the pair of spaced frames 1, 11, so that heavy tools, such as the single shaft tool 7 or the multi-shaft tool 8, may be securely supported.

Figure 4:
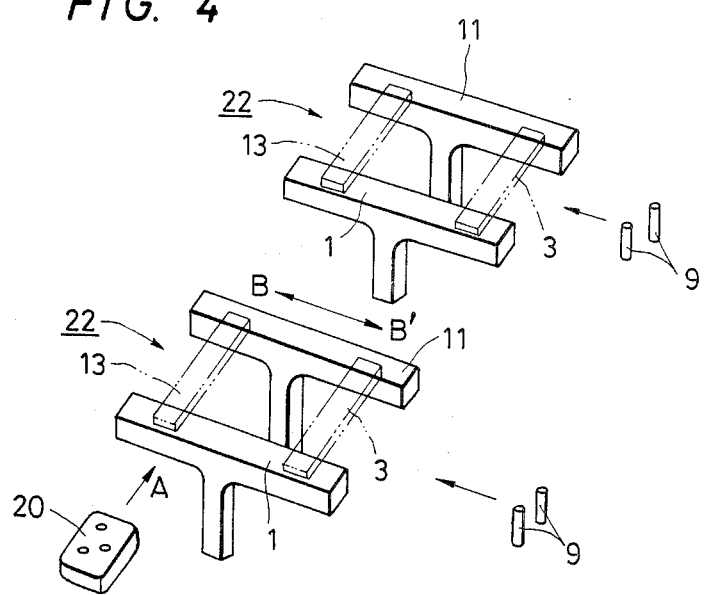
FIG. 4 is a diagrammatic view in perspective illustrating the arrangement along an assembly line of a plurality of assembly systems of the present invention.
Figure 5:
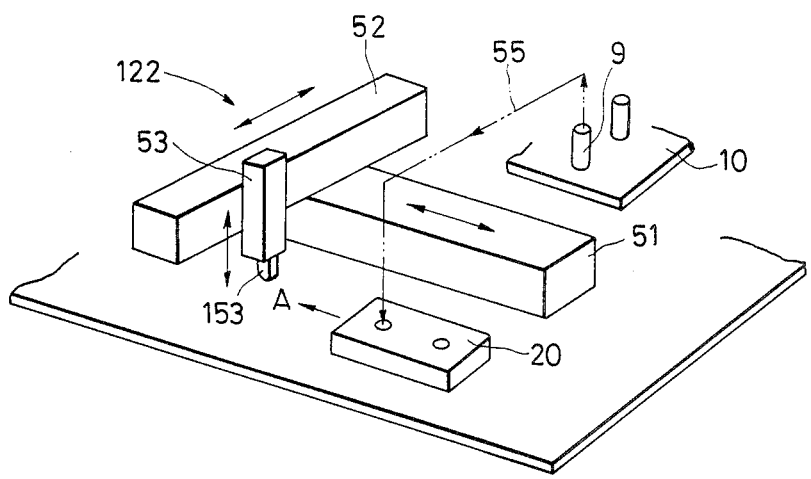
FIG. 5 is a diagrammatic view in perspective of a prior automated assembly system of the type wherein components are carried in a direction transverse to the path of a workpiece for attachment to such workpiece.

Generally, a wide variety of components are to be attached to an assembly line. In order to effectively attach these components 9 to the workpiece 20, a plurality of automated assembly systems 22 are arranged in the assembly line as shown in FIG. 4. In each system, the movable arm unit 3 may include means for placing the components 9 in a predetermined arrangement, and the movable unit 13 may include means for attaching the components 9 the workpiece 20.

Again, according to the present invention, the two movable arm units 3, 13 are each independently movable transversely in a direction perpendicular to the direction of conveyance of the workpiece, so as to place the components in a precise orientation, and then attach them to the workpiece. This results not only in an increase in the number of assembly steps per station during automatic assembly, but also in a reduction in space to one half that of the prior system where two separate assembly units are required.

Additionally, while only one end of each arm unit is supported in the prior system, the movable arm units 3, 13, are each supported at opposite ends on the spaced supporting frames 1, 11. This enables not only a compact arrangement of the system, but also permits the use of equipment having larger and heavier tool heads.

It will be apparent to those skilled in the art that various modifications and variations can be made in the automated assembly system of the present invention without departing from the spirit or scope of the invention. Thus, it is intended that the present invention cover the modifications and variations of this invention provided they come within the scope of the appended claims and their equivalents.

What is claimed is:

1. An automated assembly system for attaching a plurality of components to a workpiece in a precise orientation relative to one another wherein the workpiece has a conveyance path in a first direction and the components are to await assembly at a position spaced from the path with an orientation different from the precise orientation for assembly, comprising:
    a pair of spaced supporting frames,
    a first elongated arm unit supported on the spaced frames at opposite ends of the unit, the first arm unit extending in a direction substantially parallel to the direction of the conveyance path;
    a second elongated arm unit supported at opposite ends of the unit on the spaced frames, the second arm unit spaced from and extending in a direction substantially parallel to the direction of the first arm unit;
    a first tool having a single shaft supported on the first unit;
    a second tool having a plurality of shafts supported on the second unit;
    means for positioning the first unit including the single shaft tool above the positioned components for gripping the individual components;
    means for moving the first unit reciprocally on the spaced frames in a direction transverse to the conveyance path of the workpiece for arranging the components in the precise orientation for assembly;
    means for positioning the second unit including the multi-shaft tool above the precisely oriented components for gripping the components; and means for moving the second unit transverse to the path of the workpiece to a position above the workpiece for attaching the components to the workpiece.

2. An automated assembly system according to claim 1 wherein the means for positioning the first unit includes a first feed screw and a first motor connected to rotate said first feed screw.

3. An automated assembly system according to claim 2 wherein the means for positioning the second unit includes a second feed screw and a second motor connected to rotate said second feed screw.

4. An automated assembly system according to claim 1 wherein each of the first and second arm units has a portion at each opposite end thereof extending above the spaced frames, one of said portions on each arm unit having a hole therethrough, wherein each of the first and second unit positioning means includes a feed screw operatively connected for moving the corresponding arm unit, the feed screw being disposed to project through the hole on the portion or the other arm unit, there being no physical contact between the feed screw and the other arm unit.

5. A method of connecting a plurality of components to a workpiece in a precise orientation relative to one another wherein the workpiece has a conveyance path in a first direction and the components are to await assembly at a position spaced from the path and with an orientation different from the precise orientation for assembly, comprising the steps of:

supporting on spaced frames a first elongated arm unit at opposite ends of the unit, the first arm unit extending in a direction substantially parallel to the direction of the conveyance path;

supporting on the spaced frames a second elongated arm unit at opposite ends of the unit, the second arm unit spaced from and extending in a direction substantially parallel to the direction of the first arm unit;

supporting on the first unit a first tool having a single shaft;

supporting on the second unit a second tool having a plurality of shafts;

positioning the first unit including the single shaft tool above the positioned components for gripping the individual components;

moving the first unit reciprocally on the spaced frames in a direction tranverse to the conveyance path of the workpiece for arranging the components in the precise orientation for assembly;

positioning the second unit including the multi-shaft tool above the precisely oriented components for gripping the components; and moving the second unit tranverse to the path of the workpiece to a position above the workpiece for attaching the components to the workpiece.

* * * * *